United States Patent
Liu et al.

(10) Patent No.: US 9,617,467 B2
(45) Date of Patent: Apr. 11, 2017

(54) LED FLUORESCENT COVER AND PREPARATION METHOD THEREOF

(71) Applicant: MLS Co., Ltd., Zhongshan, Guangdong Province (CN)

(72) Inventors: Tianming Liu, Zhongshan (CN); Hu Xiao, Zhongshan (CN); Bingbing Zhou, Zhongshan (CN)

(73) Assignee: MLS CO., LTD., Zhongshan (CN)

( * ) Notice: Subject to any disclaimer, the term of this patent is extended or adjusted under 35 U.S.C. 154(b) by 348 days.

(21) Appl. No.: 14/287,094

(22) Filed: May 26, 2014

(65) Prior Publication Data

US 2015/0275074 A1    Oct. 1, 2015

(30) Foreign Application Priority Data

Mar. 28, 2014  (CN) .......................... 2014 1 0121727

(51) Int. Cl.
  *C09K 11/02*  (2006.01)
  *C08L 83/04*  (2006.01)
  *H01L 33/50*  (2010.01)

(52) U.S. Cl.
  CPC ............. *C09K 11/025* (2013.01); *C08L 83/04* (2013.01); *H01L 33/501* (2013.01); *H01L 33/507* (2013.01)

(58) Field of Classification Search
  CPC ..... C09K 11/025; C08L 83/04; F21Y 2115/10
  See application file for complete search history.

*Primary Examiner* — Stella Yi
(74) *Attorney, Agent, or Firm* — Ming Chow; Sinorica, LLC

(57) ABSTRACT

A Light Emitting Diode (LED) fluorescent cover comprises the following components by weight: 90-96% of single-component solid silicone rubber, 3-8% of fluorescent powder and 1-2% of vulcanizer; and the preparation method includes the following steps: step 1): using mixed compound of the single-component solid silicone rubber, as well as the fluorescent powder and the vulcanizer as raw material to mix, standing for 2-4 h after mixing with open mill or internal mixer; step 2): controlling temperature, pressure and vulcanization time of vulcanizing machine according to size of the fluorescent cover mold, using the vulcanizing machine to carry out first vulcanization to the raw material that is obtained from the step 1) and placed in the fluorescent cover mold; step 3): with combined action of blower gun, taking the fluorescent cover out slowly; step 4): baking the semi-finished product in a closed space at a temperature of 150-200° C. for 1-2 h.

4 Claims, No Drawings

LED FLUORESCENT COVER AND PREPARATION METHOD THEREOF

FIELD OF THE INVENTION

The present invention relates to technical field of fluorescent cover, specifically to an LED fluorescent cover and preparation method thereof.

BACKGROUND OF THE INVENTION

Light Emitting Diode (LED), also known as luminous diode, is regarded as the fourth generation of light source to replace traditional incandescent lamp, fluorescent lamp and high intensity discharge lamp, because it is energy-saving, environment-friendly, safe, reliable, instant in starting and long in service life.

At present, there are mainly two ways of generating white light with LED lamps as follows:

The first way is generating white light through combination three LED chips of red light, green light and blue light;

The second way is generating white light by using LED chip of blue light, or combination of LED chips of blue light and red light, together with fluorescent cover made by yellow fluorescent powder and transparent colloid.

The second way is widely used to emit light at present; however, there are defects as follows: the technique of shaping the fluorescent cover using mixture of transparent colloid and fluorescent powder is complex, high in cost, non-uniform in heat conduction and light emitting, and bad in high temperature resistance; and it cannot guarantee uniformity of the mixed materials.

Some existing techniques produce LED fluorescent covers by adopting mixture of liquid epoxy resin or liquid silicone rubber with fluorescent powder, and covering the mixture onto the LED chip on the LED bracket with dispenser. For example, the Chinese patent application with an application number of 201310064846.7 disclosed an LED fluorescent lamp cover, using liquid epoxy resin or liquid silicone rubber as base stock, with yellow fluorescent powder as stuffing, forming the raw material of fluorescent lamp cover at a proportion of adding 0.3-10 weight parts of yellow fluorescent powder into 100 weight parts of base stock, and then obtaining the fluorescent lamp cover of required shape after injection molding, curing and mold release. The grain size of the fluorescent powder grain is 5-25 um. And the epoxy resin is bisphenol A epoxy resin.

However, because of using the liquid epoxy resin or liquid silicone rubber as base stock, the above technique is troublesome, and the fluorescent powder is easy to precipitate unevenly and the efficiency is low.

Another Chinese patent application with an application number of 201010586506.7 disclosed a preparation method of LED component, comprising steps of: 1) crystallizing chips in a support in a solid manner, leading wires to form electrodes; 2) mixing fluorescent powder with adhesive higher in viscosity in adhesive of bi-component silica gel to form fluorescent powder adhesive, defoaming the fluorescent powder adhesive to obtain defoamed fluorescent powder adhesive, mixing the defoamed fluorescent powder adhesive with adhesive lower in viscosity in the adhesive of the bi-component silica gel to form mixed adhesive, encapsulating the chips in the step 1) with the mixed adhesive and solidifying the silica gel to obtain the LED component. Because viscosity of the normal bi-component addition type silica gel is 2000-6000 cps, the fluorescent powder is easy to subside in the silica gel system if the grain size of the fluorescent powder is too big or the viscosity of the silica gel is low, it needs to be used within half an hour generally. If the mixing time is too long, the fluorescent powder subsides, which directly influences the optical coherence after encapsulation, namely the color temperature consistency and brightness consistency and so on.

Another Chinese patent application with an application number of 201310430400.1 disclosed a high thixotropic LED jelly glue preventing deposition of fluorescent powder, which by means of preferred coupling agent and optimized hydrolysis condition, modifies fumed silica to obtain thixotropic material, and modifies fluorescent powder to obtain anti-deposition fluorescent powder. The thixotropic material is added into the silica gel system to obtain a high thixotropic silica gel system with a high thixotropic index up to 5; jelly glues of different color temperature can be made integratively by adding different amount and different kinds of modified fluorescent powder into the system, the jelly glues will not deposit within the expiration date of 3 months, and the color temperature value does not change after encapsulation. The inventive jelly glue is packaged in cylinder and can be used directly on the dispenser without need of any mould, and it shapes automatically after dispensing.

The above techniques adopt high thixotropic single-component silica gel and modified fluorescent powder, manufacturing of the jelly glue involves many raw materials, and the process is very complex.

SUMMARY OF THE INVENTION

One of the major targets of the present invention is to avoid disadvantages of the prior art and provide an LED fluorescent cover, with advantages of low cost, high luminousness, uniform emitted light, long service life and optical coherence.

The other major target of the present invention is to avoid disadvantages of the prior art and provide a preparation method of LED fluorescent cover, which is very simple and can save material cost and solve deposition problem of fluorescent powder.

In order to achieve the above objectives, the present invention is embodied by the follow technical solution:

Provides an LED fluorescent cover, comprising the following components by weight: 90-96% of single-component solid silicone rubber, 3-8% of fluorescent powder and 1-2% of vulcanizer.

Preferably, the LED fluorescent cover, comprises the following components by weight: 91-95% of single-component solid silicone rubber, 4-7% of fluorescent powder and 1-2% of vulcanizer.

Preferably, the LED fluorescent cover, comprises the following components by weight: 92-94% of single-component solid silicone rubber, 3-6% of fluorescent powder and 1-2% of vulcanizer.

Preferably, the LED fluorescent cover, comprises the following components by weight: 96% of single-component solid silicone rubber, 3% of fluorescent powder and 1% of vulcanizer.

In order to achieve the above objectives, the present invention is embodied by the follow technical solution:

Provides a preparation method of LED fluorescent cover, including the following steps: step 1): mixing materials: using the single-component solid silicone rubber, the fluorescent powder and the vulcanizer as raw material to mix, standing for 2-4 h after mixing with open mill or internal mixer; step 2): first vulcanization: controlling temperature, pressure and vulcanization time of vulcanizing machine according to size of the fluorescent cover mould, using the vulcanizing machine to carry out first vulcanization to the raw material that is obtained from the step of mixing material and placed in the fluorescent cover mould; step 3): taking out semi-finished product: with combined action of blower gun, taking the fluorescent cover out slowly from the fluorescent cover mould; step 4): second vulcanization: baking the semi-finished product in a closed space at a temperature of 150-200° C. for 1-2 h.

Preferably, in the above technical solution, in step 2), size of the fluorescent cover mould is as follows accordingly: being capable of molding 164 fluorescent covers with a diameter of 14 mm, a height of 16 mm and a thickness of 1.5 mm; temperature of the vulcanizing machine being controlled to be 150-170° C.; the pressure being 150-180 MPa; vulcanization time being 220-250 S; the temperature in the closed space in the second vulcanization step is controlled to be 180° C., and the baking time being 2 h.

Preferably, in the above technical solution, in step 2), size of the fluorescent cover mould is as follows accordingly: being capable of molding 130 fluorescent covers with a diameter of 20 mm, a height of 21.5 mm and a thickness of 1.5 mm; temperature of the vulcanizing machine being controlled to be 150-170° C.; the pressure being 200-250 MPa; vulcanization time being 250-280 S; the temperature in the closed space in the second vulcanization step is controlled to be 180° C., and the baking time being 2 h.

Preferably, in the above technical solution, in step 2), size of the fluorescent cover mould is as follows accordingly: being capable of molding 50 fluorescent covers with a diameter of 29 mm, a height of 13 mm and a thickness of 1.5 mm; temperature of the vulcanizing machine being controlled to be 150-170° C.; the pressure being 200-250 MPa; vulcanization time being 320-380 S; the temperature in the closed space in the second vulcanization step is controlled to be 180° C., and the baking time being 2 h.

Preferably, in the above technical solution, in step 2), surface of the fluorescent cover mould needs to be subjected to sand blasting treatment.

More preferably, in the above technical solution, in step 2), glass sand, corundum or mixed sand is blasted to surface of the fluorescent cover mould.

The beneficial effects of the present invention are as follows:

(1) The LED fluorescent cover of the present invention, because cost of the single-component solid silicone rubber is greatly lower than that of the liquid silicone rubber, can save material cost.

(2) The LED fluorescent cover of the present invention, because the single-component solid silicone rubber is used, compared with the liquid silicone rubber or liquid epoxy resin used in the existing technique, can solve the deposition problem of fluorescent powder, so the optical coherence of the LED fluorescent cover is good.

(3) The LED fluorescent cover of the present invention, because the components are reasonable: 96% of single-component solid silicone rubber, 3% of fluorescent powder and 1% of vulcanizer, and the above components are subjected to special manufacturing technique, the light emitted by the LED fluorescent cover is uniform, and the luminousness thereof can be 10-20% higher than that of the LED fluorescent cover made of the liquid silicone rubber and relevant preparation technique in the existing technique, and the service life thereof can be 100000 hours at most.

(4) The preparation method of the LED fluorescent cover includes using the single-component solid silicone rubber, the fluorescent powder and the vulcanizer as raw material to mix, standing for 2-4 h after mixing with open mill or internal mixer; then controlling temperature, pressure and vulcanization time of vulcanizing machine according to size of the fluorescent cover mould, using the vulcanizing machine to carry out first vulcanization to the raw material that is obtained from the step of mixing material and placed in the fluorescent cover mould; and taking the fluorescent cover out slowly from the fluorescent cover mould with combined action of blower gun; baking the semi-finished product in a closed space at a temperature of 150-200° C. for 1-2 h at last. Therefore, the preparation method is simple, and can save the process cost.

DETAILED DESCRIPTION OF THE PREFERRED EMBODIMENTS

The following is the further description of the present invention in combination with embodiments.

Embodiment 1

An LED fluorescent cover as shown in the embodiment is comprised of the following components by weight:

95-96% of single-component solid silicone rubber, 3% of fluorescent powder and 1-2% of vulcanizer, The single-component solid silicone rubber is also called single-component mixing type silicone rubber, generally in a semi-solid state before processing. It is stuffed into metallic mould in use and cured by a flat vulcanizing machine or other vulcanizing machines under a condition of high temperature and high pressure. The single-component silicone rubber is so called to distinguish the bi-component silicone rubber. The difference from the bi-component silicone rubber is that it is not necessary to add adhesive (curing agent) into the single-component silicone rubber, because the latent curing agent has already added into the production formula. This type of curing agent can start to react and cure when it meets either proper high temperature or proper water molecules.

The model number of the fluorescent powder is: NS550/NS565/NS600.

The model number of the vulcanizer is: C-15.

The color temperature of the LED fluorescent cover of the embodiment is 7000K.

A preparation method of the above LED fluorescent cover, comprising the following steps:

Step 1): mixing materials: using formula amount of the single-component solid silicone rubber, the fluorescent powder and the vulcanizer as raw material to mix, standing for 2-4 h after mixing with open mill or internal mixer;

Step 2): sand blasting: the surface of the fluorescent cover mould is subjected to sand blasting treatment according to actual requirements; if the surface of the fluorescent cover mould is necessary to be glossy, glass sand is blasted to surface of the fluorescent cover mould; if the surface of the fluorescent cover mould is necessary to be matte, the corundum or mixed sand is blasted to surface of the fluorescent cover mould; if there is no specific requirement, mixed sand is blasted to surface of the fluorescent cover mould.

Step 3): first vulcanization: according to size of the fluorescent cover mould, being capable of molding 164 fluorescent covers with a diameter of 14 mm, a height of 16 mm and a thickness of 1.5 mm; controlling the temperature of the vulcanizing machine to be 150-170° C.; the pressure being 150-180 MPa; vulcanization time being 220-250 S; using the vulcanizing machine to carry out first vulcanization to the raw material that is obtained from the step of mixing material and placed in the fluorescent cover mould;

Step 4): taking out semi-finished product: with combined action of blower gun, slowly taking out the fluorescent cover, the semi-finished product obtained after the first vulcanization, from the fluorescent cover mould;

Step 5): second vulcanization: baking the semi-finished product in a vertical oven at a temperature of 180° C. for 2 h to obtain the plate like LED fluorescent cover sheet;

Step 6): manufacturing finished products: releasing the plate like LED fluorescent cover manually or by punching process to obtain the separate LED fluorescent cover product.

The LED fluorescent cover obtained in the embodiment 1 has advantages of low cost, high luminousness, uniform emitted light, long service life and optical coherence.

Embodiment 2

An LED fluorescent cover as shown in the embodiment is comprised of the following components by weight:

91-92% of single-component solid silicone rubber, 7% of fluorescent powder and 1-2% of vulcanizer, The color temperature of the LED fluorescent cover of the embodiment is 2700K.

A preparation method of the above LED fluorescent cover, comprising the following steps:

Step 1): mixing materials: using formula amount of the single-component solid silicone rubber, the fluorescent powder and the vulcanizer as raw material to mix, standing for 2-4 h after mixing with open mill or internal mixer;

Step 2): sand blasting: the surface of the fluorescent cover mould is subjected to sand blasting treatment according to actual requirements; if the surface of the fluorescent cover mould is necessary to be glossy, glass sand is blasted to surface of the fluorescent cover mould; if the surface of the fluorescent cover mould is necessary to be matte, the corundum or mixed sand is blasted to surface of the fluorescent cover mould; if there is no specific requirement, mixed sand is blasted to surface of the fluorescent cover mould.

Step 3): first vulcanization: according to size of the fluorescent cover mould, being capable of molding 130 fluorescent covers with a diameter of 20 mm, a height of 21.5 mm and a thickness of 1.5 mm; controlling the temperature of the vulcanizing machine to be 150-170° C.; the pressure being 200-250 MPa; vulcanization time being 250-280 S; using the vulcanizing machine to carry out first vulcanization to the raw material that is obtained from the step of mixing material and placed in the fluorescent cover mould;

Step 4): taking out semi-finished product: with combined action of blower gun, slowly taking out the fluorescent cover, the semi-finished product obtained after the first vulcanization, from the fluorescent cover mould;

Step 5): second vulcanization: baking the semi-finished product in a vertical oven at a temperature of 180° C. for 2 h to obtain the plate like LED fluorescent cover sheet;

Step 6): manufacturing finished products: releasing the plate like LED fluorescent cover manually or by punching process to obtain the separate LED fluorescent cover product.

The LED fluorescent cover obtained in the embodiment 2 has advantages of low cost, high luminousness, uniform emitted light, long service life and optical coherence.

Embodiment 3

An LED fluorescent cover as shown in the embodiment is comprised of the following components by weight:

92.5-93.5% of single-component solid silicone rubber, 5.5% of fluorescent powder and 1-2% of vulcanizer, The color temperature of the LED fluorescent cover of the embodiment is 4850K.

A preparation method of the above LED fluorescent cover, comprising the following steps:

Step 1): mixing materials: using formula amount of the single-component solid silicone rubber, the fluorescent powder and the vulcanizer as raw material to mix, standing for 2-4 h after mixing with open mill or internal mixer;

Step 2): sand blasting: the surface of the fluorescent cover mould is subjected to sand blasting treatment according to actual requirements; if the surface of the fluorescent cover mould is necessary to be glossy, glass sand is blasted to surface of the fluorescent cover mould; if the surface of the fluorescent cover mould is necessary to be matte, the corundum or mixed sand is blasted to surface of the fluorescent cover mould; if there is no specific requirement, mixed sand is blasted to surface of the fluorescent cover mould.

Step 3): first vulcanization: according to size of the fluorescent cover mould, being capable of molding 50 fluorescent covers with a diameter of 29 mm, a height of 13 mm and a thickness of 1.5 mm; controlling the temperature of the vulcanizing machine to be 150-170° C.; the pressure being 200-250 MPa; vulcanization time being 320-380 S; using the vulcanizing machine to carry out first vulcanization to the raw material that is obtained from the step of mixing material and placed in the fluorescent cover mould;

Step 4): taking out semi-finished product: with combined action of blower gun, slowly taking out the fluorescent cover, the semi-finished product obtained after the first vulcanization, from the fluorescent cover mould;

Step 5): second vulcanization: baking the semi-finished product in a vertical oven at a temperature of 180° C. for 2 h to obtain the plate like LED fluorescent cover sheet;

Step 6): manufacturing finished products: releasing the plate like LED fluorescent cover manually or by punching process to obtain the separate LED fluorescent cover product.

The LED fluorescent cover obtained in the embodiment 3 has advantages of low cost, high luminousness, uniform emitted light, long service life and optical coherence.

At last, what to be specified is that the above embodiment is only used to explain the technical solution of the present invention, but not to limit the protective scope of the present invention. Although the present invention is explained in detail referring to preferable embodiment, the persons skilled in the art shall understand that it is possible to modify or equivalently replace the technical solution of the present invention without departing from the substance and scope of the technical solution of the present invention.

What is claimed is:

1. An LED fluorescent cover, comprising the following components by weight: 90-96% of single-component solid silicone rubber, 3-8% of fluorescent powder and 1-2% of vulcanizer.

2. The LED fluorescent cover according to claim 1, comprising the following components by weight: 91-95% of single-component solid silicone rubber, 4-7% of fluorescent powder and 1-2% of vulcanizer.

3. The LED fluorescent cover according to claim 1, comprising the following components by weight: 92-94% of single-component solid silicone rubber, 3-6% of fluorescent powder and 1-2% of vulcanizer.

4. The LED fluorescent cover according to claim 1, comprising the following components by weight: 96% of single-component solid silicone rubber, 3% of fluorescent powder and 1% of vulcanizer.

* * * * *